United States Patent [19]
Matsumoto

[11] 4,316,207
[45] Feb. 16, 1982

[54] V-GROOVE SEMICONDUCTOR MEMORY DEVICE

[75] Inventor: Takashi Matsumoto, Kawasaki, Japan

[73] Assignee: Fujitsu Limited, Kawasaki, Japan

[21] Appl. No.: 120,093

[22] Filed: Feb. 11, 1980

[30] Foreign Application Priority Data

Feb. 19, 1979 [JP] Japan .................................. 54-18256

[51] Int. Cl.³ ................... H01L 27/02; H01L 29/78; H01L 29/06; G11C 11/24
[52] U.S. Cl. ........................................ 357/41; 357/24; 357/55; 365/149
[58] Field of Search ...................... 357/23, 24, 41, 55; 307/238; 365/149, 182, 186

[56] References Cited
U.S. PATENT DOCUMENTS
4,252,579 2/1981 Ho et al. .............................. 357/41

Primary Examiner—Gene M. Munson
Attorney, Agent, or Firm—Staas & Halsey

[57] ABSTRACT

A semiconductor device in which gates are formed in V-shaped grooves formed in a semiconductor bulk, which device has VMIS transistors for storing information by inserting or removing electric charges that are stored in junction capacitances in regions that are embedded in the vicinity of the tips of the V-shaped grooves. The feature of the semiconductor device resides in that the capacitor region, consisting of an embedded layer of capacitors distributed over a large area, is divided by the tips of the plurality of V-shaped grooves.

7 Claims, 19 Drawing Figures

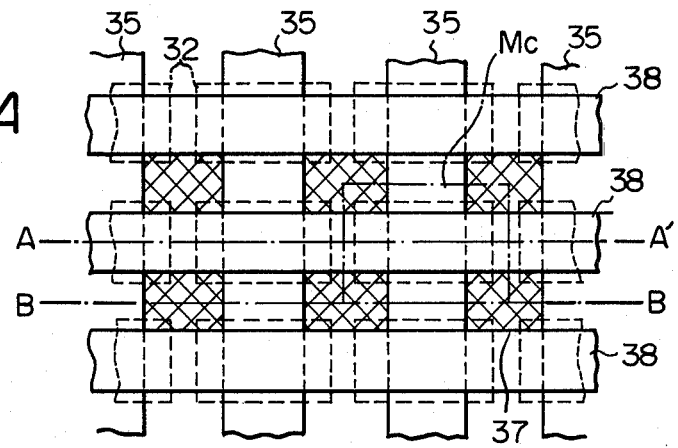
Fig. 4A
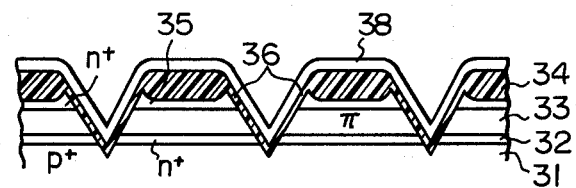
Fig. 4B
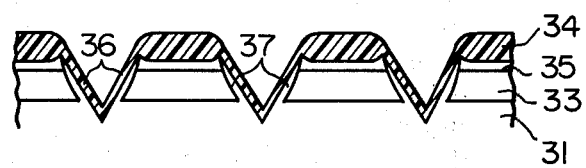
Fig. 4C
Fig. 5
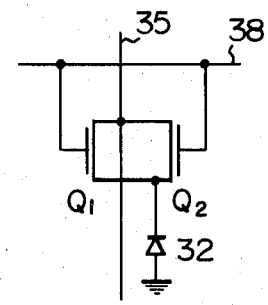
Fig. 7
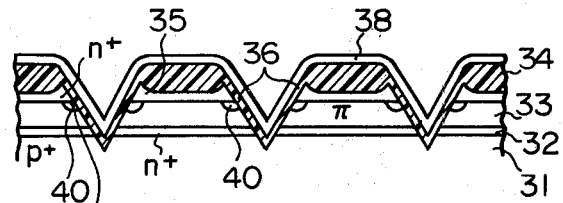

V-GROOVE SEMICONDUCTOR MEMORY DEVICE

BACKGROUND OF THE INVENTION

1. Field of the Invention

The present invention relates to an improved semiconductor device which is suited for use as a VMIS (V-groove metal insulator semiconductor) dynamic RAM (random access memory).

2. Description of the Prior Art

There has heretofore been known a memory cell of the type of a VMIS one-transistor/cell as one type of a semiconductor memory device for use in a large-capacity highspeed RAM. In the memory cells of the VMIS-type, usually, a single V-shaped groove corresponding to a single capacitor region. Therefore, it is difficult to obtain memory cells of good quality unless exact precision is obtained to bring the capacitor region and the V-shaped groove into position during the manufacturing step.

According to another conventional example, a capacitor region is divided by a V-shaped groove to form capacitor regions on both sides of the V-shaped groove. Namely, the capacitor region formed in the shape of a column is divided by an elongated groove. With the above-mentioned construction, a single independent capacitor region is divided by a V-shaped groove to form two capacitor regions, i.e., to form two memory cells. Therefore, when the mutual arrangement of the capacitor region and the V-shaped groove is not precise, either one of the divided, embedded layers will have a small area, causing the capacitance of the capacitor of the memory cell to become smaller than a predetermined value. Since the capacitance determines an electric charge-retaining time, i.e., determines the memory-retaining characteristics related to the refreshing cycle, the minimum value must be strictly ensured. In the above-mentioned conventional examples, therefore, the area of the embedded layer must be increased by taking into consideration the deviation in position of the V-shaped groove, causing the degree of integration to be decreased. In particular, since the V-shaped groove is formed after the epitaxial layer has been grown on the embedded layer, there is not a clear pattern which helps to attain the positioning. Hence, the position of the V-shaped groove tends to be greatly varied, making the aforementioned problem more serious.

SUMMARY OF THE INVENTION

The object of the present invention is to provide a VMIS-type memory cell which requires less precision for bringing V-shaped grooves into position relative to the capacitor regions.

Another object of the present invention is to provide a VMIS-type memory cell in which an embedded layer having a large area is divided by many V-shaped grooves to form many capacitor regions.

A further object of the present invention is to provide a VMIS-type memory cell which is designed for increasing the degree of integration.

A yet further object of the present invention is to provide a VMIS-type memory cell which is so constructed as to prevent the dispersion of the areas of the capacitor regions which are divided by the V-shaped grooves.

To achieve the above-mentioned objects, the VMIS-type memory cell of the present invention pertains to a semiconductor device in which gates are formed in V-shaped grooves that are formed in a semiconductor bulk, and which device has VMIS transistors which provide access to information by giving or taking out electric charges with respect to junction capacitances established by capacitor regions that are embedded in the vicinity of the tips of V-shaped grooves, wherein the capacitor regions are embedded over a large area and divided by the tips of a plurality of V grooves.

Further features and advantages of the present invention will be apparent from the ensuing description with reference to the accompanying drawings to which, however, the scope of the invention is in no way limited.

BRIEF DESCRIPTION OF THE DRAWINGS

FIGS. 4A, 4B and 4C are, respectively, a plan view illustrating an important portion of a VMIS-type memory cell according to the present invention, a cross-sectional view along the line A-A', and a cross-sectional view along the line B-B';

FIG. 5 is a diagram of an equivalent circuit of the VMIS-type memory cell illustrated in FIGS. 4A, 4B and 4C;

FIG. 7 is a cross-sectional view illustrating an important portion of the VMIS-type memory cell according to another embodiment of the present invention.

DETAILED DESCRIPTION OF THE PREFERRED EMBODIMENTS

Figure 1:
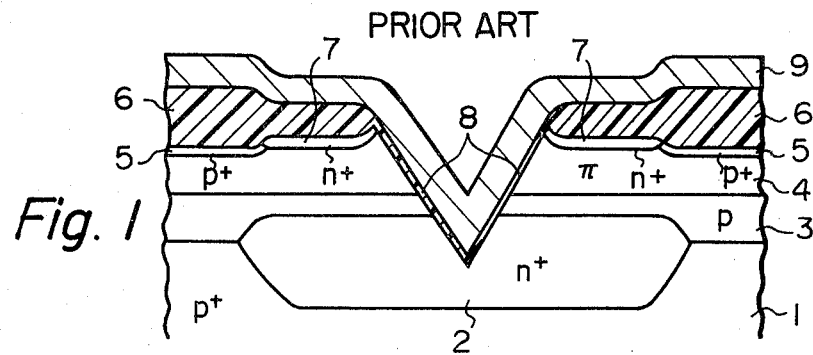
FIG. 1 is a side view illustrating, in cross section, an important portion of a conventional VMIS-type memory cell.

FIG. 1 illustrates a conventional VMIS-type memory cell, including a p+-type semiconductor substrate 1, an n+-type source-junction capacitor region 2 for accumulating electric charge, an epitaxially grown p-type semiconductor layer 3, an epitaxially grown π-type semiconductor layer 4, a p+-type channel stopping region 5, a field insulating film of silicon dioxide 6, an n+-type drain region (bit line) 7, a gate insulating film of silicon dioxide 8, and a gate electrode (word line) 9. The capacitor region 2 accumulates the electric charge in the pn-junction capacitance which is formed around the periphery thereof. When the π-type semiconductor layer 4 is being grown, the p-type semiconductor layer 3 is formed by the p-type impurities such as boron atoms which rise up from the substrate 1.

In the VMIS memory cell, a single V-shaped groove usually corresponds to a single capacitor region 2. In producing the memory cells, therefore, sufficient attention must be given to the positioning of the capacitor region 2 and the V-shaped groove, and it is necessary to provide exact precision for attaining the positioning. Otherwise, it is difficult to obtain memory cells of consistently good quality.

Figure 2A:
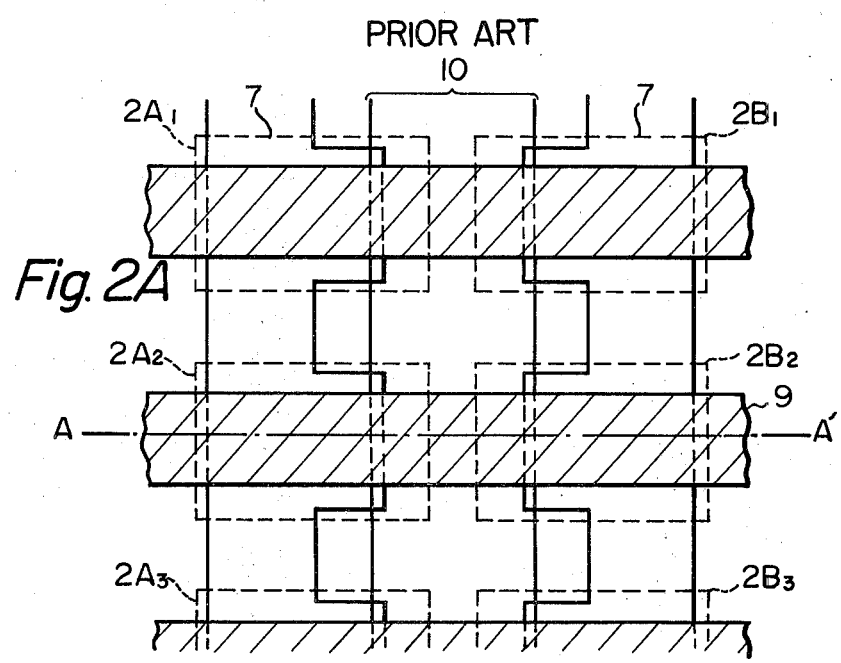
FIGS. 2A and 2B are, respectively, a plan view illustrating an important portion of another conventional VMIS-type memory cell, and a cross-sectional view along the line A-A'.
Figure 2B:
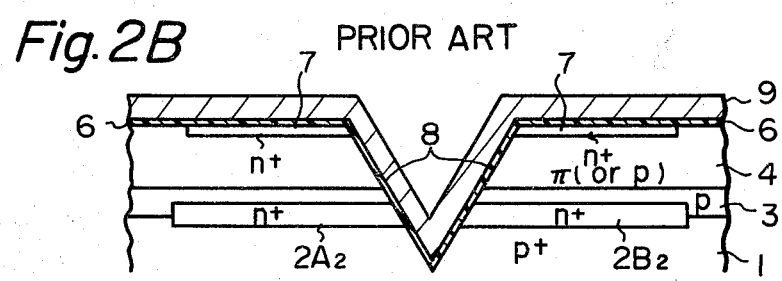

FIGS. 2A and 2B are diagrams illustrating another conventional example, that is, FIG. 2A is a plan view illustrating important portions and FIG. 2B is a cross-sectional view along the line A-A' of FIG. 2A. The portions corresponding illustrated in FIG. 1 are denoted by the same symbols.

The difference of this example from the example of FIG. 1 is that capacitor regions 2A$_1$, 2A$_2'$, ... and 2B$_1$, 2B$_2$, ... are formed on both sides of a V-shaped groove 10. Namely, the capacitor regions formed in the shape of a column are divided by an elongated V-shaped groove.

The following steps are usually employed for producing semiconductor devices of the above-mentioned other conventional example. An example of the manufacturing steps are illustrated below with reference to FIGS. 3A to 3D.

Figure 3A:
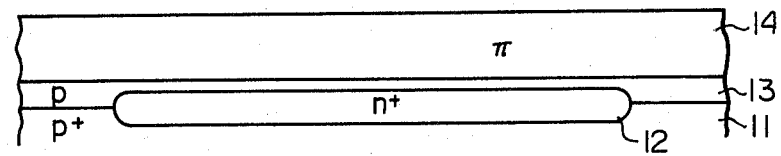
FIGS. 3A to 3D are diagrams illustrating the steps for manufacturing the conventional memory cell of FIG. 2.

With reference to FIG. 3A:

(1) A suitable mask is formed on a p$^+$-type silicon semiconductor substrate 11 having the plane index (100), and n-type impurities having a slow diffusion rate, such as arsenic atoms, are introduced thereby to form an n$^+$-type embedded layer 12. The p-type impurities contained in the substrate 11 must have a relatively high diffusion rate, such as that of boron atoms, and a high concentration (for example, greater than $10^{17}$ cm$^{-3}$).

(2) A $\pi$-type (or p$^-$-type) silicon semiconductor layer 14 is allowed to grow using a suitable epitaxial growth method. During this step, or in the subsequent heat-treatment step, the p-type impurities contained in the substrate 11 rise up to form a p-type silicon semiconductor layer 13. P-type impurities are diffused overcoming the n-type impurities due to the difference in the diffusion rate of impurities.

Figure 3B:
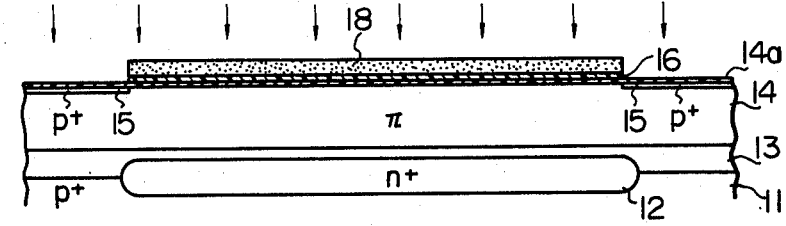

With reference to FIG. 3B:

(3) A silicon nitride film 16 is formed after a very thin silicon dioxide film 14a has been formed on the surface of the semiconductor layer 14. Here, the silicon dioxide film 14a is formed so that the surface of the semiconductor layer 14 does not become coarse by formation of the silicon nitride film 16.

(4) The silicon nitride film 16 is patterned using a photoresist mask 18 based on a commonly employed photolithographic technique.

(5) A p$^+$-type channel stopping region 15 is formed by ion implantation, i.e., by selectively implanting boron ions.

Figure 3C:
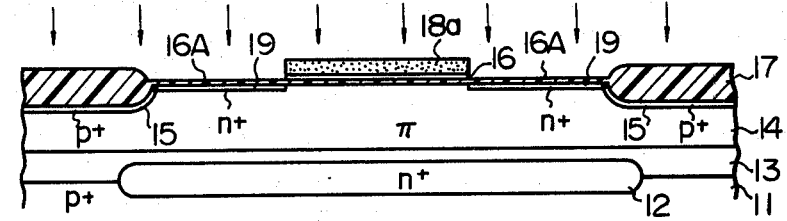

With reference to FIG. 3C;

(6) After the photoresist mask 18 has been removed, a field insulating film 17 of silicon dioxide is formed by the method of selective oxidation using the silicon nitride film 16 as a mask. FIG. 3C illustrates the silicon nitride film 16 after the patterning is effected twice. The silicon nitride film 16 therefore is small in size.

(7) A photoresist mask 18a is formed by the conventional photolithographic technique, and the silicon nitride film 16 is patterned thereby to form windows 16A for forming drain regions.

(8) An n$^+$-type drain region 19 is formed by implanting arsenic ions by the ion implantation method while leaving the photoresist mask 18a that was used for patterning the silicon nitride film 16. The n$^+$-type drain region 19 serves as a bit line.

Figure 3D:
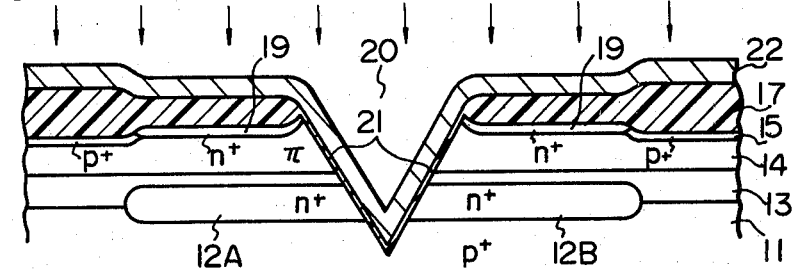

With reference to FIG. 3D:

(9) After the photoresist mask 18a is removed, an insulating film of silicon dioxide is formed on the surface of the drain region 19 by selective oxidation using the silicon nitride film 16 as a mask. The insulating film is also denoted by 17.

(10) The silicon nitride film 16 and the lower thin film 14a of silicon dioxide are removed.

(11) A V-shaped groove 20 is formed by etching the silicon bulk using an anisotropic etching solution which is chiefly composed of potassium hydroxide. The V-shaped groove 20 has such a depth that its tip divides the n$^+$-type embedded layer 12. The capacitor regions 12A, 12B are thus formed.

(12) Thereafter, a gate insulating film 21 is formed in the V-shaped groove 20 by a conventional method, and a gate electrode 22 that serves as a word line is formed to complete the device.

Although plan views were not referred to in the above description, the V-shaped groove 20 is formed in an elongated manner like the V-shaped groove 10 of FIG. 2A. Many capacitor regions, i.e. memory cells, are formed by the V-shaped groove 20.

According to the aforementioned method, a single independent embedded layer is divided by a single V-shaped groove to form two capacitor regions, i.e., to form two memory cells. Therefore, if the relative arrangement between the embedded layer 12 and the V-shaped groove 20 is not correct, one part of the divided embedded layer acquires a small area. This means that the capacitance of the memory cell is smaller than a predetermined value. Since the capacitance determines the electric charge-retaining time or, in other words, determines the characteristics for retaining memory related to the refreshing cycle, the minimum value must be strictly ensured. To cope with this problem according to the above-mentioned conventional example, the embedded layer must have an increased area to absorb the deviation in the position of the V-shaped groove, causing the degree of integration to be decreased. In particular, since the V-shaped grooves 20 are formed after the epitaxial layer 14 has been formed on the embedded layer 12, there is no clear pattern which helps attain the positioning. Therefore, the positioning tends to be inconsistent.

The present invention is illustrated below in detail in conjunction with the indicated embodiments.

FIG. 4A is a plan view illustrating important portions, FIG. 4B is a cross-sectional view along the line A-A' of FIG. 4A, and FIG. 4C is a cross-sectional view along the line B-B' of FIG. 4A.

FIGS. 4A to 4C show a p$^+$-type semiconductor substrate 31, an n$^+$-type capacitor region 32, a $\pi$-type or a p$^-$-type semiconductor layer 33, a field insulating film of silicon dioxide 34, an n$^+$-type drain region (bit line) 35, a gate insulating film of silicon dioxide 36, a p$^+$-type impurity region for isolation (channel stopper) 37 and a gate electrode of polycrystalline silicon 38. A portion surrounded by a dot-dash line and denoted by Mc, represents a memory cell. Further, although not shown, a p-type layer is formed on the n$^+$-type capacitor region 32 by the rising up of impurities, like the conventional counter-part.

According to this embodiment, the capacitor region 32 is first formed in the form of a belt which is in parallel with the line A-A' and is then divided by a plurality of V-shaped grooves to realize the construction as shown. The drain region 35 which are connected to bit lines extend over the whole surface after the impurities are introduced and are divided by the V-shaped grooves to form a pattern which is suited for forming the bit lines. In order that the memory cells in the V-shaped grooves are completely isolated, the p$^+$-type impurity region 37 is formed by ion implantation, for example, boron ions using the gate electrode 38 of polycrystalline silicon as a mask. Further, as will be obvious from the portion denoted by Mc, a memory cell is of a construction in which a single capacitor region is commonly has two MIS FET's that are formed on the walls on one side of each of two neighboring V-shaped grooves. An equivalent circuit of the memory cell is as shown in FIG. 5, in which $Q_1$ and $Q_2$ denote two MIS FET's. Other numerals denote the same portions as mentioned with reference to FIGS. 4A to 4C.

Below is mentioned the production of the device of FIGS. 4A to 4C in conjunction to FIGS. 6A to 6G.

Figure 6A:
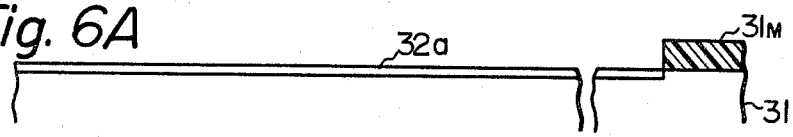
FIGS. 6A to 6G are diagrams illustrating the steps for manufacturing the VMIS-type memory cell which is illustrated in FIGS. 4A, 4B and 4C.

With reference to FIG. 6A:

(1) A mask 31M of silicon dioxide is formed on a $p^+$-type silicon semiconductor substrate 31 having a plane index of (100) and an impurity concentration of about $10^{17}$ to $10^{18}$ cm$^{-3}$. The mask 31M has an opening for forming an $N^+$-type embedded layer that serves as a capacitor region.

(2) Arsenic ions are implanted by an ion implantation method thereby to form an $n^+$-type embedded layer 32a.

Figure 6B:
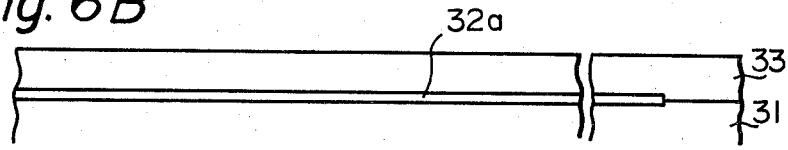
Figure 6C:
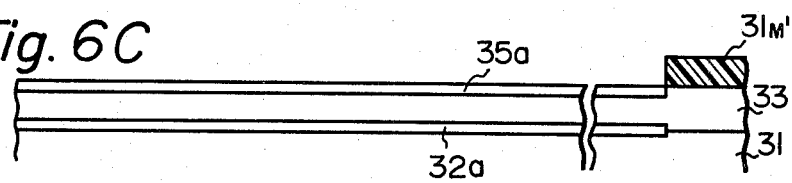
Figure 6D:
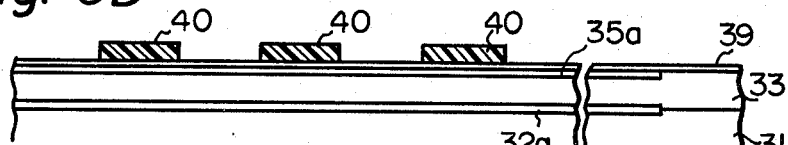

With reference to FIG. 6B:

(3) After the mask 31M is removed, a $\pi$-type (or $p^-$-type) silicon semiconductor layer 33 is epitaxially grown. During the period of growth, impurities are not added, or a very small amount of boron is added. Although not shown, a p-type silicon semiconductor layer will in practice be interposed between the substrate 31 and the semiconductor layer 33. The reason is as mentioned already with reference to FIG. 3A:

(4) A mask 31M' of silicon dioxide is formed again, and arsenic or phosphorus is introduced into the whole memory region to form an $n^+$-type impurity region 35a.

Figure 6E:
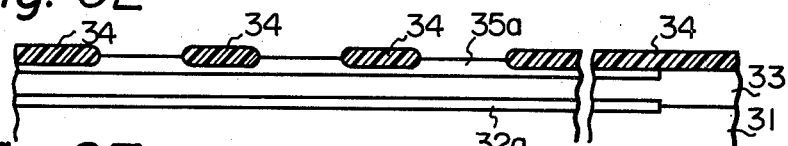

With reference to FIG. 6E:

(5) A silicon dioxide film 39 is formed to a thickness of, for example, 500 Å on the surface of the semiconductor layer 33, and then a silicon nitride film 40 is formed by a chemical vapor deposition method.

(6) The silicon nitride film 40 is patterned by the photolithographic technique, and those of the portions other than the portions of V-shaped grooves are removed.

With reference to FIG. 6E:

(7) Field insulating films 34 of a thickness of about 0.5 to 1.0 μm are formed by effecting the selective oxidation using the silicon nitride film 40 as a mask.

(8) The silicon nitride film 40 is removed, and then the silicon dioxide film 39 is removed. In this case, since the insulating films 34 have a great thickness, the etching presents no problem. This step helps expose the surface of the silicon semiconductor layer in which the V-shaped grooves are to be formed.

Figure 6F:
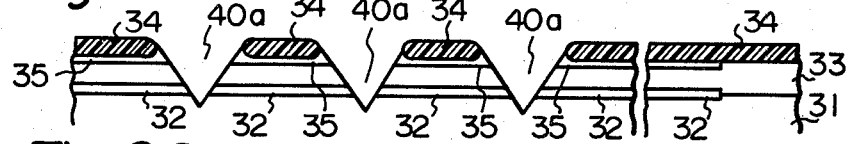

With reference to FIG. 6F:

(9) V-shaped grooves 40a are formed by etching the silicon bulk using the insulating films 34 as masks. The etching solution employed here has anisotropic properties. Thus, the $n^+$-type embedded layer and the $n^+$-type impurity region are divided to form capacitor regions 32 and drain regions 35.

Figure 6G:
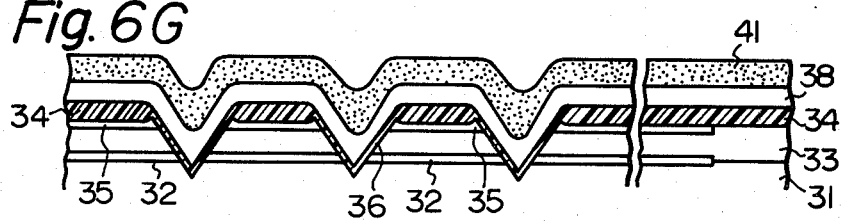

With reference to FIG. 6G:

(10) A gate insulating film 36 is formed in the V-shaped grooves 40a.

(11) A polycrystalline silicon film is formed by, for example, a chemical vapor deposition method.

(12) A photoresist mask 41 is formed by the conventional photolithographic technique, and the polycrystalline silicon film is patterned to form gate electrodes 38 (word lines).

(13) $P^+$-type impurity regions 37 (refer to FIG. 4C) are formed by implanting, for example, boron ions into the walls of the V-shaped grooves 40a by the ion implantation method while leaving the photoresist mask 41.

(14) Thereafter, the metallization is formed by a customary manner to complete the device.

According to the above-mentioned embodiment, positioning of V-shaped grooves can be attained easily and, further, less precision is required for attaining the positioning.

FIG. 7 illustrates the semiconductor memory device according to another embodiment of the present invention.

With the VMIS-type memory cell illustrated in FIG. 4B, when the potential of the drain region 35 is higher than the potential of the capacitor region 32, i.e., when information is written with the polarity of the forward direction, if the depletion layer which extends from the drain region 35 reaches the entire region of the $\pi$-type semiconductor layer 33, the depletion layer is stopped by the p-type semiconductor region which is formed on the capacitor region 32, so that the depletion layer does not expand to the capacitor region. In the p-type region, there also remains a region which is not occupied by the depletion layer, whereby a predetermined threshold gate voltage is applied, and a punch-through withstand voltage is also maintained. Therefore, there is no electrical conductivity unless a positive voltage is applied to the gate electrode 38. On the contrary, when the potential of the drain region 35 is lower than the potential of the capacitor region 32, i.e., when the $n^+$-type bit line region 35 has a low potential or ground potential and when the $n^+$-type capacitor region 32 is positively charged and is maintained at a positive potential, a relatively great voltage in the reverse direction is applied to the pn junction between the capacitor region 32 and the p-type semiconductor layer formed on the capacitor region 32. In this case, the depletion layer extending from the pn junction tends to expand over the whole p-type semiconductor layer and further said depletion layer expands to the $\pi$-type semiconductor layer. Here, due to the so-called short-channel effect, the threshold gate voltage is decreased, and a punch through from the capacitor region 32 to the bit line region 35 takes place at a relatively small voltage. The decrease in punch-through withstand voltage means that a reduced amount of electric charge is stored in the capacitor region 32 which has a predetermined area, i.e, which has a predetermined pn-junction capacitance, since high potential is not allowed to be maintained. Accordingly, it is difficult to increase the amount of electric charge stored in the junction of the capacitor region 32 to maintain sufficient margin, and it also becomes difficult to reliably store the memory when refreshing operation is carried out over extended periods of time.

According to the embodiment of FIG. 7, the semiconductor device is so constructed as to exhibit an increased withstand voltage in the reverse direction, so that punch through will not develop even when sufficient electric charge is accumulated in the junction which is formed by the capacitor region.

In this embodiment, impurity regions 40 are formed in the vicinity of the drain regions (bit lines) to prevent the development of the short channel effect which occurs when a device operates with opposite direction is applied.

The p-type impurity regions 40 are formed beneath the drain region 35 in the step of FIG. 6F by implating for example, boron ions by the ion implantation method after the drain region 35 has been formed. Other steps are the same as those of FIGS. 6A to 6G.

In the device shown in FIG. 7, when a positive charge is accumulated in the junction capacitance formed by the capacitor region 32 and when the bit line region 35 is of a low potential or of a ground potential, the depletion layer which extends from the capacitor region 32 and which occupies the p-type semiconductor layer does not reach the p-type impurity regions 40 which are present beneath the drain region 35. Accordingly, the transistor can be rendered conductive or non-conductive by establishing or extinguishing the channel in the interface between the p-type impurity regions 40 and the gate insulating film 36 responsive to a gate potential. Therefore, the short channel effect does not develop even when a voltage of opposite polarity is applied, and the threshold gate voltage and the punch through withstand voltage are not decreased, either. Further, since the p-type impurity regions 40 determine the threshold gate voltage when a device operates with opposite direction, the impurity concentration should range from, for example, $10^{16}$ to $10^{17}$ cm$^{-3}$, which is nearly equal to that of the p-type semiconductor layer, and should further be brought into contact with the gate insulating film 36. The p-type impurity regions 40 need not necessarily be brought into contact with the n+-type bit line region 35. From the viewpoint of the manufacturing steps, however, it is advantageous to bring the p-type impurity regions 40 into contact with the n+-type bit line region 35.

As will be understood from the foregoing description, the present invention deals with a semiconductor device having VMIS transistors which read or write information by giving or taking out an electric charge with respect to a junction capacitance formed by a semiconductor region, i.e, formed by a capacitor region which is embedded in a semiconductor substrate of one conductivity type, wherein the capacitor region having large areas is divided by a plurality of V-shaped grooves into a plurality of capacitor regions. Therefore, the positioning can be easily attained when the V-shaped grooves are to be formed, requiring less precision. The above-mentioned effects can be further enhanced if the drain regions are also divided by the V-shaped grooves like the capacitor regions. According to the present invention, however, the areas of the capacitor regions formed by a large embedded layer will be dispersed because of the same reasons as those of the aforementioned conventional art. This, however, gives only the slightest effect for the integrity of the all the elements.

Although the foregoing description has dealt with the case in which the semiconductor substrate 31 was the p+-type semiconductor substrate, similar VMIS-type memory cells can also be obtained by using the n-type semiconductor substrate provided the polarities of the capacitor regions 32, semiconductor layers 33 and drain regions 35 are reversed.

What is claimed is:

1. In a semiconductor device in which gates are formed at the sides of V-shaped grooves that are formed in a semiconductor bulk of a first conductivity type, the gates being part of VMIS transistors for controlling information by transferring electric charge to the junction capacitance of plural capacitors that are embedded in the vicinity of the tips of the V-shaped grooves, the improvement comprising each said capacitor consisting of a single respective portion of a respective one of at least one embedded layer of semiconductor of the opposite conductivity type, each said embedded layer extending uniformly over a respective extended area of said substrate under each of said V-shaped grooves, and each said single respective portion extending between an adjacent pair of said V-shaped grooves, and each said single embedded layer being divided into a plurality of said capacitors of equal area and capacitance by the tips of the V-shaped grooves.

2. The device of claim 1, each adjacent pair of said V-shaped grooves being equally spaced, and said dividing of each said embedded layer resulting in said plurality of capacitor regions having uniform capacitance.

3. A semiconductor memory device comprising:
a silicon semiconductor substrate of a first conductivity type;
at least one embedded layer of opposite conductivity type formed on said silicon semiconductor substrate, each said embedded layer extending along a first direction;
a silicon semiconductor layer having a conductivity that is limited to at most a low conductivity of said first type formed over each said embedded layer on said silicon semiconductor substrate;
an impurity region of said opposite conductivity type formed on said silicon semiconductor layer;
a plurality of field insulating films extending on said impurity region in a second direction transverse to said first direction to cross each of said embedded layers;
a plurality of V-shaped grooves extending in said second direction between said field insulating films, the tips of said grooves reaching said silicon semiconductor substrate to divide each said embedded layer, said silicon semiconductor layer and said impurity region to form said plural capacitors of each said at least one embedded layer and drain regions of said impurity region,
a gate insulating film formed on the sides of each said V-shaped groove; and
a gate electrode film extending in the first direction in correspondence with each one of said embedded layers, each said gate electrode film crossing over each said gate insulating film aligned along the corresponding embedded layer and extending in the second direction.

4. The device of claim 3, wherein said semiconductor substrate is of the p-type, said capacitor regions are of n+-type, said silicon semiconductor layers is of p−-type, and said drain regions are of n+-type.

5. The device of claim 3, wherein said semiconductor substate is of n-type, said capacitor regions are of p+-type, said silicon semiconductor layer is of n−-type, and said drain regions are of p+-type.

6. The device of claim 3, comprising each said drain having a further impurity region of conductivity type opposite to that of said drain regions in the vicinity adjacent to each said drain region, to the respective ones of said gate insulating films in said V-grooves and to said divided silicon semiconductor layer, so as to prevent a short channel effect in each respective portion of said divided semiconductor layer.

7. The device of claim 3, said silicon semiconductor layer having conductivity of the intrinsic type.

* * * * *

UNITED STATES PATENT AND TRADEMARK OFFICE
CERTIFICATE OF CORRECTION

PATENT NO. : 4,316,207
DATED : Feb. 16, 1982
INVENTOR(S) : Takashi Matsumoto

It is certified that error appears in the above—identified patent and that said Letters Patent is hereby corrected as shown below:

```
Column 3, line 3, "portions corresponding" should be
          --corresponding portions--.
Column 4, line 62, "region" should be --regions--.
Column 5, line 4, delete "is";
Column 5, line 36, "6E" should be --6D--.
Column 7, line 28, after "layer" insert --33--;
Column 7, line 54, delete "the" (second occurrence).
Column 8, line 52, "layers" should be --layer--.
```

Signed and Sealed this

Twenty-second Day of June 1982

[SEAL]

Attest:

Attesting Officer

GERALD J. MOSSINGHOFF

*Commissioner of Patents and Trademarks*